United States Patent [19]

McNeely

[11] Patent Number: 4,814,879

[45] Date of Patent: Mar. 21, 1989

[54] SIGNAL PHASE ALIGNMENT CIRCUITRY

[75] Inventor: David L. McNeely, Indianapolis, Ind.

[73] Assignee: RCA Licensing Corporation, Princeton, N.J.

[21] Appl. No.: 82,419

[22] Filed: Aug. 7, 1987

[51] Int. Cl.$^4$ .............................................. H04N 5/04
[52] U.S. Cl. ..................................... 358/148; 358/158
[58] Field of Search ....................... 358/148, 149, 158; 307/55, 56, 63

[56] References Cited

U.S. PATENT DOCUMENTS

| | | | |
|---|---|---|---|
| 3,911,368 | 10/1975 | Tarczy-Hornoch | 328/155 |
| 4,399,416 | 8/1983 | Gillespie | 330/86 |
| 4,500,852 | 2/1985 | Phillips | 331/12 |
| 4,600,895 | 7/1986 | Landsman | 331/1 A |
| 4,617,679 | 10/1986 | Brooks | 375/119 |
| 4,635,097 | 1/1987 | Tatami | 358/13 |
| 4,675,612 | 6/1987 | Adams et al. | 328/55 |
| 4,679,005 | 7/1987 | Tatami | 331/16 |
| 4,713,621 | 12/1987 | Nakamura et al. | 328/55 |

Primary Examiner—James J. Groody
Assistant Examiner—David E. Harvey
Attorney, Agent, or Firm—Eugene M. Whitacre; Paul J. Rasmussen; Eric P. Herrmann

[57] ABSTRACT

Circuitry for aligning the transition of a clock signal to transitions of a horizontal line synchronizing signal includes a series of delay elements which provide a plurality of clock signal phases. The longest phase delay provided by this circuitry is greater than the period of the clock signal. The clock signal and the delayed clock signal phases are applied to circuitry which selects one clock signal phase, which has a transition occurring within a predetermined time interval of the transition in the horizontal line synchronizing signal. Other circuitry, coupled to this selection circuitry, inhibits the selection of any clock phase having a greater time delay than the selected phase. This prevents the selection of multiple clock phase signals.

3 Claims, 2 Drawing Sheets

SIGNAL PHASE ALIGNMENT CIRCUITRY

This invention relates to automatic phase control (APC) circuitry which uses a controllable phase shifter to align the phase of an oscillator signal to that of a reference signal.

U.S. Pat. No. 3,911,368 entitled "Phase Interpolating Apparatus and Method", which is hereby incorporated by reference, relates to circuitry for aligning the transitions of a clock signal to those of a reference signal. In this system, a multiplicity of flip-flops and gating circuits are used to select the phase of a multi-phase clock signal which is closest to having a transition coincident with a transition in the reference signal.

The system described in the above-referenced patent is shown, in simplified form, in FIG. 1. A source of oscillatory signal 10 provides an oscillatory signal OSC which is applied to a chain of three delay elements, 14, 16 and 18. Each of these delay elements provides a time delay substantially equal to one-quarter of the period of the oscillatory signal OSC. Thus, the signal OSC and the output signals of the delay elements 14, 16 and 18 represent four different, equally spaced phases of the signal OSC. The signal OSC is applied to the input terminal, D, of a data-type flip-flop 22 and the output signals of the delay elements 14, 16 and 18 are applied to the D input terminals of the respective flip-flops 24, 26 and 28. A source of reference signal 12 provides a signal REF to the clock input terminal, CK, of each of the flip-flops 22, 24, 26 and 28.

In this configuration the flip-flops 22, 24, 26 and 28 effectively take a "snapshot" of the waveform of the signal OSC at the time that the flip-flops are clocked by the signal REF. In other words, the states of the various flip-flops 22, 24, 26 and 28 represent one period of the signal OSC sampled at time intervals determined by the delay elements 14, 16 and 18. The standard output signal, Q, and the complemented output signal, $\overline{Q}$, of the flip-flops 22, 24, 26 and 28 are applied to respective first and second input terminals of NOR gates 40, 42, 44 and 46. These NOR gates pass one of the phases of the signal OSC, which are applied to the respective third input terminals of the NOR gates, to the OR gate 60, the output signal of which is the final output oscillatory signal $OSC_F$.

As selected by this circuitry, the signal $OSC_F$ has a positive going transition which occurs approximately coincident with a positive-going transition of the signal REF. To understand how the circuitry aligns these signals, consider the following example. Assume that, when the flip-flops 22, 24, 26 and 28 are clocked by a positive-going transition of the signal REF, their respective states are 0, 0, 1 and 1. This set of states indicates that a negative-going transition of the signal OSC leads the positive-going transition of the signal REF by between one-quarter and one-half of a period of the signal OSC.

As set forth above, The three input terminals of the NOR gate 40 are connected to the output terminal, Q, of the flip-flop 22; the inverted output terminal, $\overline{Q}$, of the flip-flop 24; and the output terminal of the source of oscillatory signal 10. The corresponding input terminals of the NOR gate 42 are similarly connected to the Q output terminal of the flip-flop 24, the $\overline{Q}$ output terminal of the flip-flop 26 and the output terminal of the delay element 14, respectively. The three input terminals of the NOR gate 44 are connected to the Q output terminal of the flip-flop 26, the $\overline{Q}$ output terminal of the flip flop 28 and the output terminal of the delay element 16, respectively. The NOR gate 46 is coupled so that its three input terminals are connected to the Q output terminal of the flip-flop 28, the $\overline{Q}$ output terminal of the flip-flop 22 and the output terminal of the delay element 18.

In the example set forth above, the Q output terminals of the flip-flops 22, 24, 26 and 28 provide output values of 0, 0, 1 and 1, respectively. The $\overline{Q}$ output terminals of these flip-flops provide respective output values of 1, 1, 0 and 0. Consequently, the NOR gates 40, 44 and 46 always provide logic 0 output values and the NOR gate 42 provides an output signal that is the logical inverse of the signal provided by the delay element 14. The output signals provided by the NOR gates 40, 42, 44 and 46 are applied to respectively different input terminals of the OR gate 60. In the example set forth above, the output signal of the OR gate 60 is the same as the output signal of the NOR gate 42. This signal has a positive-going transition which is approximately coincident with the positive-going transition of the signal REF. The phase of the signal OSC that is selected and then inverted by the circuits shown in FIG. 1 may change with each positive-going edge of the signal REF. However, the final selected and inverted phase will have at least one transition that is synchronized to a transition in the signal REF.

One application of the phase alignment circuitry shown in FIG. 1, is in a consumer digital television receiver which uses a sampling clock signal that is locked in phase to the horizontal line synchronizing signal component of the received video signals (i.e. a line-locked clock signal). Although the clock signal is locked in phase to the line synchronizing signal, there may be significant timing errors in the occurrence of the first pulse of the sampling clock following the occurrence of a pulse of the horizontal line synchronizing signal. These timing errors may distort the image reproduced from samples taken using this sampling clock signal. This distortion causes vertical or diagonal edges in the image to appear wavy or jagged.

The system shown in FIG. 1 could be expanded by adding delay elements and decoding stages to provide a clock signal that corrects this type of distortion. An exemplary system for use in an NTSC receiver, would have 63 serially connected delay elements, providing 63 equally timed clock phases. The time delay through all of the delay elements would be substantially equal to one period of the signal OSC. Each of the 63 delay elements would be connected to a respectively different decoding stage, including a flip-flop and a NOR gate. An expanded system of this type would produce a line-locked signal having a frequency of 910 times the frequency, $f_h$, of the horizontal line synchronizing signal, with an accuracy of ±1 nanosecond (ns) relative to the horizontal synchronizing signal.

This system is not without problems, however. To reduce the cost of the system it would be desirable for the phase alignment circuitry to be implemented as a single integrated circuit. When the delay elements used by this system are buffer gates, implemented using standard processing techniques, the amount of time delay provided each one may vary by as much as −50% and +100% of the nominal value. Thus, if these delay elements were implemented to provide a nominal time delay value such that the sum of all of the nominal delay values equaled the period of the clock signal, the actual total delay provided may be as little as one-half of the clock period or as much as two clock periods. In the first instance, the phase alignment circuitry may not produce an output clock signal. This would occur when the values stored in the flip-flops do not include a transition of the line locked clock signal. In the second instance, signals provided by two or more of these delay elements may be selected and inverted. Due to timing differences between these two phases, their combination in the OR gate may introduce undesirable high frequency signal components in the output clock signal and may change the duty cycle of the clock signal.

It would be desirable if integrable phase alignment circuitry could be designed which does not have the problems set forth above.

SUMMARY OF THE INVENTION

The present invention is embodied in circuitry for aligning an oscillatory signal into a predetermined phase relationship with a reference signal. The circuitry includes a delay line which provides M signals representing M successively delayed phases of the oscillatory signal. The delay line provides at least one phase signal that is delayed by more than one period of the oscillatory signal relative to the undelayed oscillatory signal. The phase alignment circuitry further includes gating circuitry, coupled to the M output terminals of the delay line, for selecting one of the M signals provided by the delay line. This selected signal has a predetermined phase relationship with the reference signal and has a time delay with respect to the undelayed oscillatory signal that is less than one period of the oscillatory signal. The system further includes circuitry which inhibits the selection of ones of said M signals having greater time delays than that of the selected signal. The selected signal is the output signal of the phase alignment circuitry.

DETAILED DESCRIPTION

Figure 1:
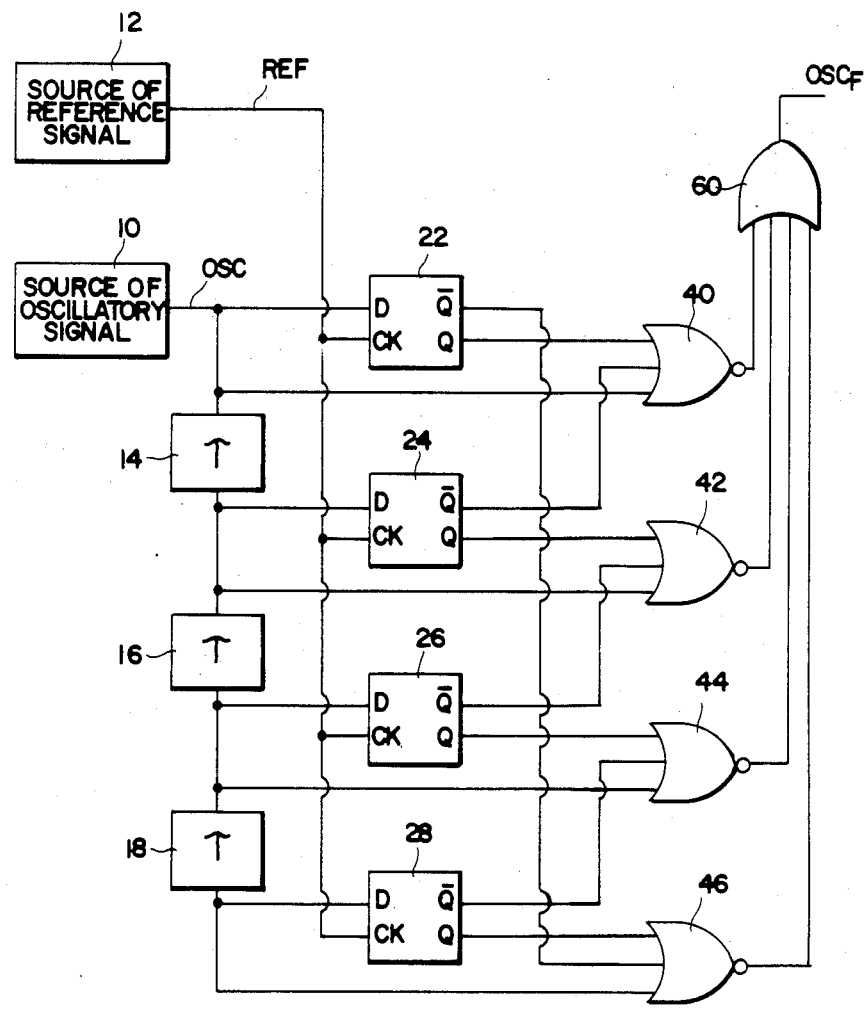
FIG. 1, described above, is a block diagram showing exemplary phase alignment circuitry of the prior art.
Figure 2:
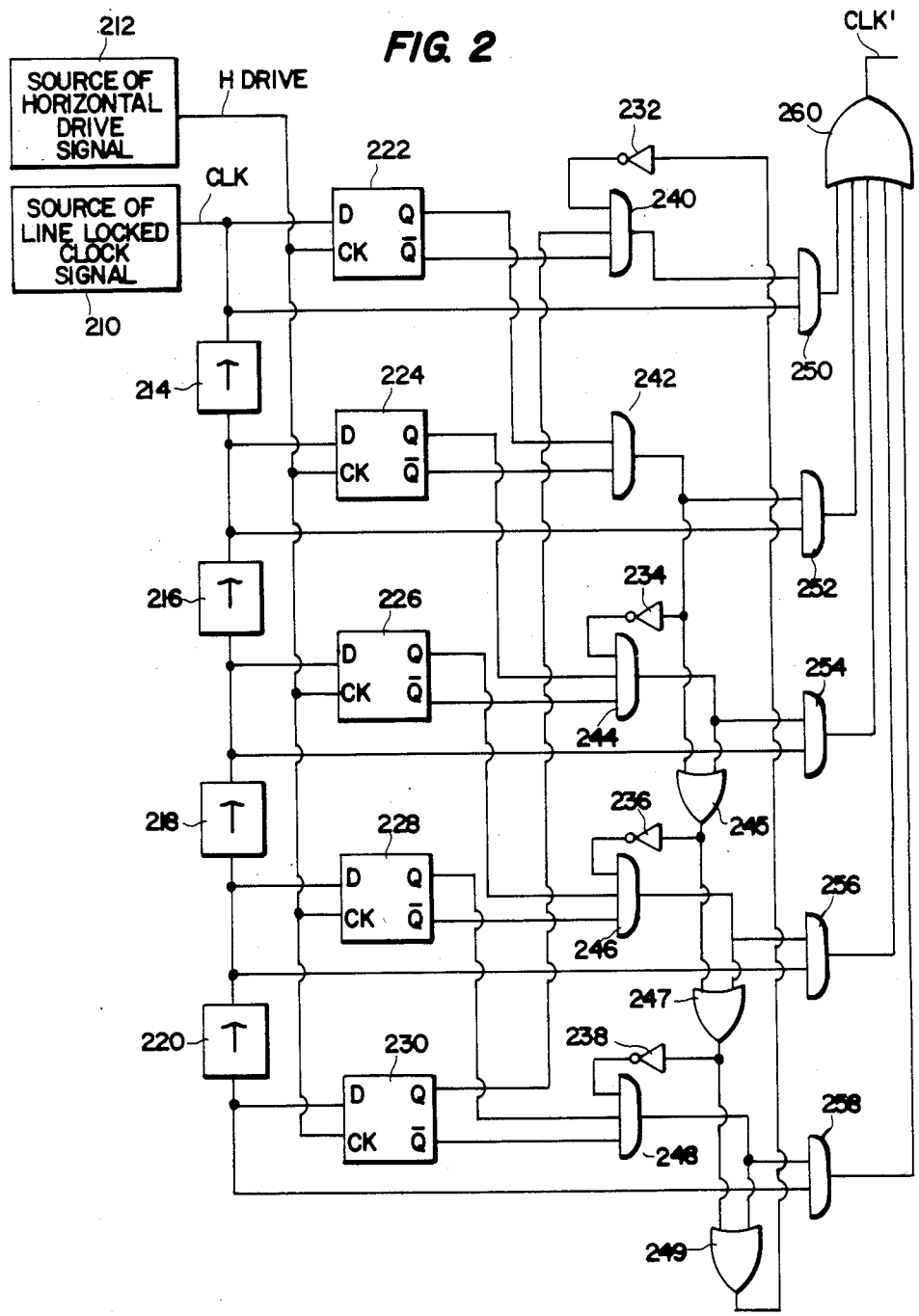
FIG. 2 is a block diagram showing signal phase alignment circuitry which embodies the present invention.

The embodiment of the invention shown in FIG. 2 is in the context of a television signal processing system. This circuitry, is generally similar to the prior art circuitry described in reference to FIG. 1, but has significant structural differences which overcome the shortcomings of that prior art circuit. The circuitry shown in FIG. 2 is used to align a line-locked clock signal, CLK, with a horizontal drive signal, HDRIVE. This circuitry consists of five stages including four delay elements. If this circuitry were used in an NTSC television receiver having a clock frequency of 910 times the frequency, $f_H$, of the horizontal line synchronizing signal, the clock signal, CLK', produced by the phase alignment circuitry would be synchronized to the horizontal drive signal with an accuracy of $1/(3 \times 910 f_H)$ or 23 ns. In an actual system, accuracies of approximately 1 ns may be desirable. Signal phase alignment circuitry which achieves a ±1 ns accuracy would include at least 64 stages having 63 delay elements in the delay line. The smaller number of stages and delay elements were selected in the present embodiment to simplify the explanation of the invention. However, one skilled in the art will appreciate how to construct the 64 stage version after reading this application.

In FIG. 2, a source of line locked clock signal, 210 provides the signal CLK to a delay element 214, the first delay element in a chain of delay elements 214, 216, 218 and 220. The source 210 used in this embodiment of the invention includes a phase locked loop (PLL) circuit which produces the signal CLK having a frequency substantially equal to 910 $f_H$ and locked in phase to the horizontal line synchronizing signal component of an input composite video signal. The delay elements 214, 216, 218 and 220 used in this embodiment of the invention are conventional buffer gates. The amount of time delay provided by each of the buffer gates is the signal propagation delay through the gate circuitry.

Each of the delay elements 214, 216, 218 and 220 delays the signal applied to its input terminal by an amount of time nominally equal to one-third of a period of the signal CLK. Since these delay elements are realized as a portion of an integrated circuit, however, the amount of time delay provided by each of these delay elements 214, 216, 218 and 220 may vary by as much as −50% to +100%. Consequently, the total time delay provided by the four delay elements 214, 216, 218 and 220 may be between two-thirds of a period, and two and two thirds periods of the signal CLK.

The signal CLK provided by the source 210 is applied to the data input terminal, D, of a conventional data-type flip-flop 222. The output signals of the delay elements 214, 216, 218 and 220 are similarly applied to the D input terminals of respective data type flip-flops 224, 226, 228 and 230. Each of the flip-flops 222, 224, 226, 228 and 230 is clocked by the signal HDRIVE provided by a source of horizontal drive signal 212.

In this embodiment of the invention, the source 212 includes a PLL which produces the signal HDRIVE that is locked in phase to the horizontal line synchronizing signal component of the input composite video signal and has a frequency substantially equal to $f_H$.

Coincident with a positive-going transition of the signal HDRIVE, each of the flip-flops 222, 224, 226, 228 and 230 loads the value of the signal applied to its D input terminal as its internal state. The flip-flops 222, 224, 226, 228 and 230 provide these state values at their respective Q output terminals and logically complemented versions of the state values at their respective $\overline{Q}$ output terminals.

The Q and $\overline{Q}$ output terminals of the flip-flops 222–230 are coupled to logic circuitry which, based on the state values stored in the flip-flops, passes either the clock signal CLK, provided by the source 210, or one of the phase shifted clock signals provided by the delay elements 214, 216, 218 or 220, as the phase aligned output clock signal CLK'.

To understand the operation of this circuitry, it is helpful to consider the flip-flops and logic gates to be configured as a chain of five interconnected stages. The state values held in respective flip-flops 222, 224, 226, 228 and 230 represent samples of respective phases of the signal CLK having successively greater delays. In addition, the state value held by the flip-flop 222 is used by the circuitry as a sample of a phase of the signal CLK that is delayed relative to the phase which produced the sample held in the flip-flop 230. As set forth above, all of these samples are taken coincident with a positive-going transition of the signal HDRIVE. The individual stages of the gating circuits compare the samples of successive clock signal phases to determine which of the clock signal phases has a positive-going transition that is approximately coincident with the positive-going transition of the signal HDRIVE.

For example, if the state of the flip-flops 222 and 224 are logic 1 and logic 0, respectively, the phase of the signal CLK, which has a positive going transition coincident with that of the signal HDRIVE is advanced in time with respect to the signal provided by the delay element 214, and delayed in time with respect to the signal CLK provided by the source 210. The Q output terminal of the flip-flop 222 and the $\overline{Q}$ output terminal of the flip-flop 224 are coupled to respectively different input terminals of an AND gate 242. The AND gate 242 is conditioned by these input signals to apply a logic 1 value to one input terminal of an AND gate 252, enabling the AND gate 252 to pass the phase of the signal CLK that is provided by the delay element 214 to the OR gate 260.

The AND gates 244 and 254 are similarly configured to pass the clock phase signal provided by the delay element 216 to the OR gate 260, when the state of the flip-flops 224 and 226 are logic 1 and logic 0, respectively. AND gates 246 and 256 pass the signal provided by the delay element 218 when the states of the flip-flops 226 and 228 are, respectively, logic 1 and logic 0, and the AND gates 248 and 258 pass the signal provided by the delay element 220 when the respective states of the flip-flops 228 and 230 are logic 1 and logic 0. The input terminals of an AND gate 240 are coupled to the Q output terminal of the flip-flop 230 and to the $\overline{Q}$ output terminal of the flip-flop 222. The AND gate 240 conditions an AND gate 250 to pass the signal CLK, provided by the source 210, to the OR gate 260 when the states of the flip-flops 230 and 222 are logic 1 and logic 0, respectively.

The AND gates 240 and 250 ensure that the phase alignment circuitry will produce an oscillatory output signal as long as the total time delay provided by the delay elements 214, 216, 218 and 220 is greater than one-half of one period of the signal CLK. When, for example, the states of the flip-flops 222-230 span a time interval that includes a negative-going transition of a phase of the signal CLK but does not include a positive-going transition, the signal CLK' provided by the OR gate 260 will be the signal CLK. Without the AND gates 240 and 250, the circuitry shown in FIG. 2 would produce a logic 0 as the output signal CLK' in the example described above.

The description of the circuits shown in FIG. 2 has, so far, ignored the effect of the OR gates 245, 247 and 249 and of the inverters 232, 234, 236 and 238. These circuit elements are included in the phase alignment circuitry to ensure that only one clock phase signal is passed to the OR gate 260 when the total time delay represented by the delay elements 214, 216, 218 and 220 is greater than one period of the signal CLK. These circuit elements act to inhibit the gating of the delayed phases of the clock signal having time delays greater than that of a selected signal. As set forth above, applying more than one clock phase signal to the OR gate 260 may introduce undesirable high frequency signal components into, and may change the duty cycle of, the phase synchronized clock signal CLK'.

This inhibiting circuitry is included in the phase alignment circuitry as described below. The output terminal of the AND gate 242 is connected to the input terminal of an inverter 234 and to one input terminal of an OR gate 245. When the AND gate 242 provides a logic 1 output value to the AND gate 252, the inverter 234 applies a logic 0 value to one input terminal of the AND gate 244, ensuring that the AND gate 244 may not enable the AND gate 254 to apply the signal provided by the delay element 216 to the OR gate 260. The OR gate 245 is further coupled to receive an input signal from the output terminal of the AND gate 244. The output terminal of the OR gate 245 is connected through the inverter 236, to one input terminal of the OR gate 247. When either the AND gate 242 or the AND gate 244 has a logic 1 output value, the inverter 236 is conditioned to apply a logic 0 value to one input terminal of the AND gate 246, preventing the AND gate 246 from applying a logic 1 value to the AND gate 256. The other input terminal of the OR gate 247 is connected to the output terminal of the AND gate 246. The output terminal of the OR gate 247 is connected to the inverter 238 which disables the AND gate 248 when any of the AND gates 242, 244 or 246 has a logic 1 output value. The output signal provided by the OR gate 247 is logically ORed with the output signal of the AND gate 248 by the OR gate 249. The output signal provided by the OR gate 249 is inverted by the inverter 232 and applied to one input terminal of the AND gate 240. The signal provided by the inverter 232 disables the AND gate 240 when any of the AND gates 242, 244, 246 or 248 provides a logic 1 output signal.

Thus, the circuitry shown in FIG. 2 uses only one phase of the signal CLK to produce the clock signal CLK'. The signal CLK is provided by this circuitry as the signal CLK' only when the total delay provided by the chain of delay elements 214-220 is less than one period of the signal CLK and does not include a positive-going transition.

It is contemplated that the inverter 234 may be eliminated and that the OR gate 249 may be changed to a NOR gate, eliminating the inverter 232, without affecting the performance of the circuitry shown in FIG. 2. Although the sources 210 and 212 are shown as being separate in the embodiment of the invention shown in FIG. 2, it is contemplated that they may be combined to provide the signals HDRIVE and CLK from a single line-locked PLL.

The circuitry shown in FIG. 2 is described in the context of a digital television receiver having a line locked clock signal, however, it is contemplated that this circuitry may be used in other applications in which a substantially stable oscillatory signal (CLK) is to be synchronized to reference signal (HDRIVE). In addition, it is contemplated that the circuitry may be expanded to include more delay elements and more stages of gating circuits by replicating, for example, the delay element 218, flip flop 228, AND gates 246 and 256, inverter 236 and OR gate 247, the desired number of times.

What is claimed is:
1. Circuitry for substantially aligning the phase of an oscillatory signal into a predetermined phase relationship with a reference signal, comprising:
 a source of said oscillatory signal;
 a source of said reference signal;
 delay means, coupled to said source of oscillatory signal for providing M output signals, representing, respectively, M successively delayed phase of said oscillatory signal, at M respective output terminals, where M is an integer greater than 1;
 signal gating means, coupled to said delay means including M+1 stages ordinally numbered first through $(M+1)^{th}$, wherein, the $i^{th}$ stage is responsive to instantaneous values of the signals provides by the $(i-1)^{th}$ and the $i^{th}$ output terminals of the delay means, occurring coincident with a predetermined transition in said horizontal line synchronizing signal, for selectively passing the $i^{th}$ signal provided by said delay means as a phase aligned output signal where i is an integer between 2 and $M+1$; and signal inhibiting means, including M stages ordinally numbered first through $M^{th}$, wherein the $(i-1)^{th}$ stage of said inhibiting means is coupled to the $i^{th}$ and $(i+1)^{th}$ stage of said signal gating means for inhibiting the selection of $(i+1)^{th}$ through $M^{th}$ output signals provided by said delay means when the $i^{th}$ signal provided by said delay means has been selected by said signal gating means as said phase aligned output signal.

2. The circuitry set forth in claim 1 wherein:

the $M^{th}$ output signal of said delay means is delayed, with respect to said oscillatory signal, by an amount of time greater than one-half of one period of said oscillatory signal; and said signal gating means includes means coupling the $(M+1)^{th}$ stage of said gating means to the first stage of said gating means to ensure that one of said oscillatory signal and the M output signals of said delay means is selected as said phase aligned output signal.

3. The circuitry set forth in claim 1 further including signal value storage means coupled to said delay means and to said signal gating means wherein:

said oscillatory signal and said reference signal are bilevel signals, each of which alternates between having values of logic-one and logic-zero;

the M output terminals of said delaying means are ordinally numbered first through $M^{th}$;

said signal value storage means includes a binary value storage means which includes $M+1$ binary value storage circuits ordinally numbered first through $(M+1)^{th}$ each of which has a binary value input terminal, coupled to a respectively different one of said source of oscillatory signal and the M output terminals of said signal delaying means, a clock signal terminal, coupled to said source of reference signal, and first and second output terminals coupled to said gating means, wherein each of said binary value storage circuits is conditioned to storage the binary value applied to its binary value input terminal coincident with the value of said reference signal changing between logic-zero and logic one and for providing, thereafter, said stored value at its first output terminal and the logical complement of said stored value at its second output terminal;

said signal gating means includes:

$M+1$ transition detection gates ordinally numbered first through $(M+1)^{th}$, wherein a first input terminal of the $i^{th}$ transition detection gate is coupled to the second output terminal of the $i^{th}$ binary value storage circuit and a second input terminal of the $i^{th}$ transition detection gate is coupled to the first output terminal of said $(i+1)^{th}$ binary value storage circuit, for providing an output signal equivalent to the logical AND of the signals applied to its input terminals, where i is an integer between 2 and $M-2$; and $M+1$ signal gating elements ordinally numbered first through $(M+1)^{th}$, wherein a first input terminal of the $i^{th}$ signal gating element is coupled to the $(i-1)^{th}$ output terminal of the signal delaying means and a second input terminal of the $i^{th}$ signal gating means is coupled to the output terminal of the $i^{th}$ transition detection gate, for providing an output signal equivalent to the logical AND of the signals applied to its input terminals; and said inhibiting means includes M signal inverting circuits, ordinally numbered first through $M^{th}$ and $M-1$ OR gates ordinally numbered first through $(M-1)^{th}$ wherein the $i^{th}$ OR gate is coupled to receive the output signal provided by the $(i-1)^{th}$ OR gate at one input terminal and the output signal provided by the $(i+2)^{th}$ transition detection gate at a second input terminal, and to provide an output signal equivalent to the logical OR of its input signals to the $(i+1)^{th}$ inverter circuit, which is coupled to provide the logical complement of the output signal of the $i^{th}$ OR gate to a third input terminal of the $(i+3)^{th}$ transition detection gate.

* * * * *